(12) United States Patent
Behzad et al.

(10) Patent No.: US 7,890,079 B2
(45) Date of Patent: Feb. 15, 2011

(54) RFIC WITH ON-CHIP MULTIPLE BAND POWER AMPLIFIERS

(75) Inventors: Arya Reza Behzad, Poway, CA (US); Payman Hosseinzadeh Shanjani, San Diego, CA (US); Hsin-Hsing Liao, San Diego, CA (US); Hao Jiang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 804 days.

(21) Appl. No.: 11/810,220

(22) Filed: Jun. 5, 2007

(65) Prior Publication Data

US 2008/0136514 A1 Jun. 12, 2008

Related U.S. Application Data

(60) Provisional application No. 60/868,878, filed on Dec. 6, 2006, provisional application No. 60/868,881, filed on Dec. 6, 2006, provisional application No. 60/868,818, filed on Dec. 6, 2006.

(51) Int. Cl.
*H04B 1/28* (2006.01)
(52) U.S. Cl. ............. 455/333; 455/114.3; 455/127.3; 455/291; 257/197; 361/58
(58) Field of Classification Search ............. 455/333, 455/114.3, 127.3, 291; 257/197; 361/58
See application file for complete search history.

(56) References Cited

U.S. PATENT DOCUMENTS

| | | | |
|---|---|---|---|
| 6,451,633 B1 * | 9/2002 | Yoshida | 438/151 |
| 2004/0032700 A1 * | 2/2004 | Matsuno et al. | 361/58 |
| 2006/0170004 A1 * | 8/2006 | Toyoda et al. | 257/197 |

* cited by examiner

*Primary Examiner*—Sanh D Phu
(74) *Attorney, Agent, or Firm*—Garlick Harrison & Markison; Kevin L. Smith (57) ABSTRACT

A radio frequency integrated circuit (RFIC) includes a silicon substrate, CMOS processing circuitry, and a bipolar power amplifier module. The CMOS processing circuitry is on the silicon substrate. The bipolar power amplifier module is on the silicon substrate and is operable in a 5 GHz frequency band.

20 Claims, 6 Drawing Sheets

RFIC WITH ON-CHIP MULTIPLE BAND POWER AMPLIFIERS

This patent application is claiming priority under 35 USC §119 to three provisionally filed patent applications:

(1) METHOD AND SYSTEM FOR SIGNAL PROCESSING IN WIRELESS COMMUNICATIONS, having a provisional filing date of Dec. 6, 2006, and a provisional Ser. No. 60/868,818, expired;

(2) FUNCTIONALITIES OF A CHIP, having a provisional filing date of Dec. 6, 2006, and a provisional Ser. No. 60/868,881, expired; and (3) METHOD AND SYSTEM FOR SIGNAL PROCESSING, having a provisional filing date of Dec. 6, 2006, and a provisional Ser. No. 60/868,878, expired.

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

This invention relates generally to wireless communication systems and more particularly to wireless communication devices having an integrated circuit operating within such systems.

DESCRIPTION OF RELATED ART

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

An issue with the above described transmitters is providing a power amplifier that has sufficient gain and power and that can be implemented on an integrated circuit (IC). Currently, power amplifiers that amplify RF signals in the 5 GHz frequency band are implemented using a gallium arsenide IC fabrication process. Typically, the data modulation stage and the IF stage, or stages, are implemented using a CMOS (complimentary metal oxide semiconductor) process. As is known, an IC cannot have a single die that supports both CMOS circuitry and gallium arsenide circuitry. As such, current technology limitations prevent a 5 GHz power amplifier from being implemented on the same die as CMOS circuitry.

Therefore, a need exists for an integrated circuit (IC) that supports both CMOS circuitry and a 5 GHz power amplifier.

BRIEF SUMMARY OF THE INVENTION

The present invention is directed to apparatus and methods of operation that are further described in the following Brief Description of the Several Views of the Drawing(s), the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
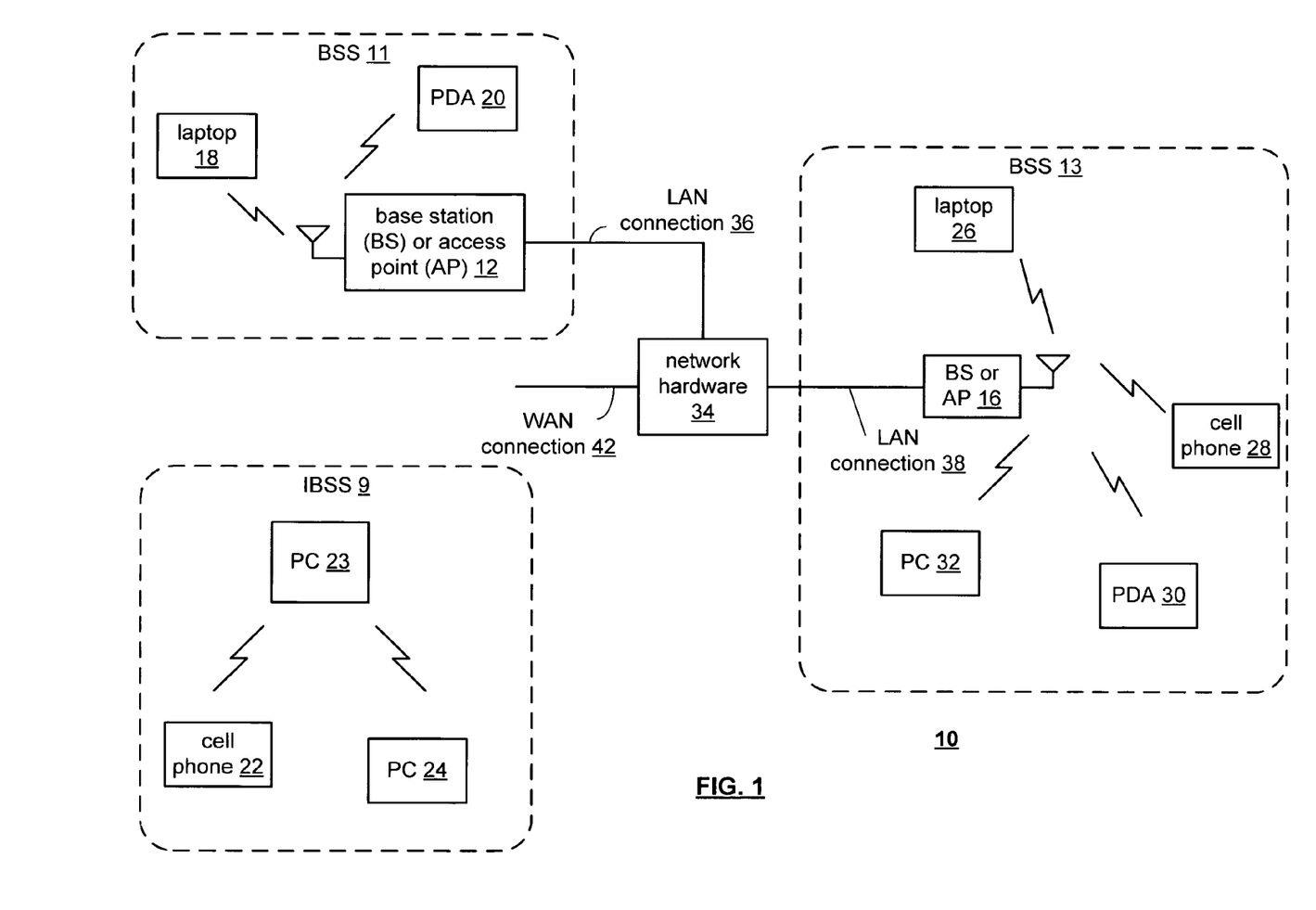
FIG. 1 is a schematic block diagram of an embodiment of a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIGS. 2-13.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12-16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
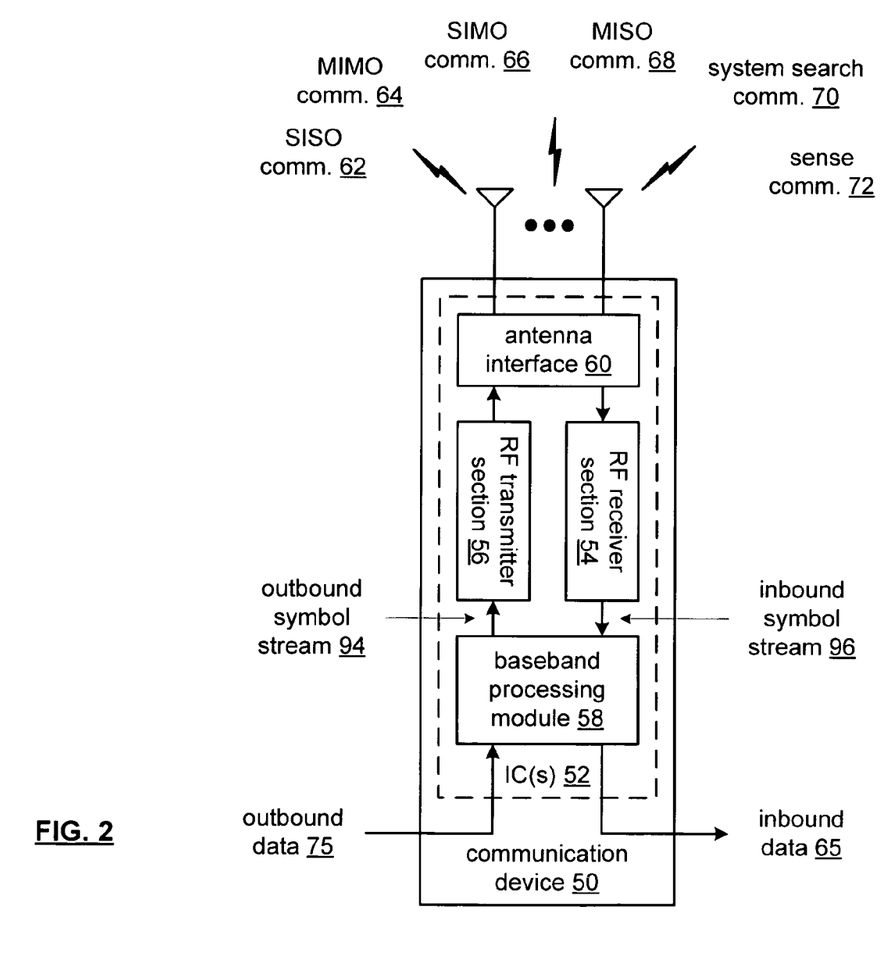
FIG. 2 is a schematic block diagram of an embodiment of a wireless communication device in accordance with the present invention.

FIG. 2 is a schematic block diagram of an embodiment of wireless communication device 50, which may be one of the communication devices 18-32 of FIG. 1 or may be another type of wireless communication device. The wireless communication device 50 includes one or more integrated circuit (IC) 52 coupled to an antenna interface 60. The one or more ICs 52 includes a radio frequency (RF) receiver section 54, an RF transmitter section 56, and a baseband processing module 58. The antenna interface 60 is coupled to an antenna system that may include one or more antennas to provide a diversity antenna structure, to provide an in-air beamforming structure, to provide a polarized antenna structure, to provide a multiple input multiple output (MIMO) communication 64 antenna structure, to provide a single input single output (SISO) communication 62 antenna structure, to provide a single input multiple output (SIMO) communication 66 antenna structure, to provide a multiple input single output (MISO0 communication 68 antenna structure, to provide a system search communication 70 (e.g., attempting authorization and/or association with a system) antenna structure, and/or to provide carrier sense communication 72 (e.g., detect an incoming wireless communication) antenna system.

The baseband processing module 58 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 2-5.

The baseband processing module 58 converts outbound data 75 (e.g., a voice signal, data, a text file, an audio file, a video file, an image file, and/or a combination thereof) into an outbound symbol stream, or streams, 94 in accordance with a wireless communication protocol (e.g., IEEE 802.11a, b, g, n, etc., Bluetooth, ZigBee, GSM, CDMA, WCDMA, EDGE, GPRS, HSDPA, HSUPA, etc.). The baseband processing module 58 also converts an inbound symbol stream, or streams, 96 into inbound data 65 (e.g., a voice signal, data, a text file, an audio file, a video file, an image file, and/or a combination thereof).

The RF receiver section 54 converts an inbound RF signal, or signals, into the inbound symbol stream, or streams, 96 based on a receive local oscillation. The RF transmitter section 56 is coupled to convert the outbound symbol stream, or streams, 94 into an outbound RF signal, or signals.

In an embodiment, the RF transmitter section 56 includes at least one on-chip 5 GHz power amplifier module as will be described in greater detail with reference to FIGS. 3-7. In addition, or in the alternative, the RF transmitter section 56 may include circuitry to protect the power amplifier module from damage due to mismatches when it is transmitting at higher power levels. Further, to provide the higher power levels, the RF transmitter section 56 may include a plurality of on-chip power amplifier modules coupled in parallel via an impedance matching network.

Figure 3:
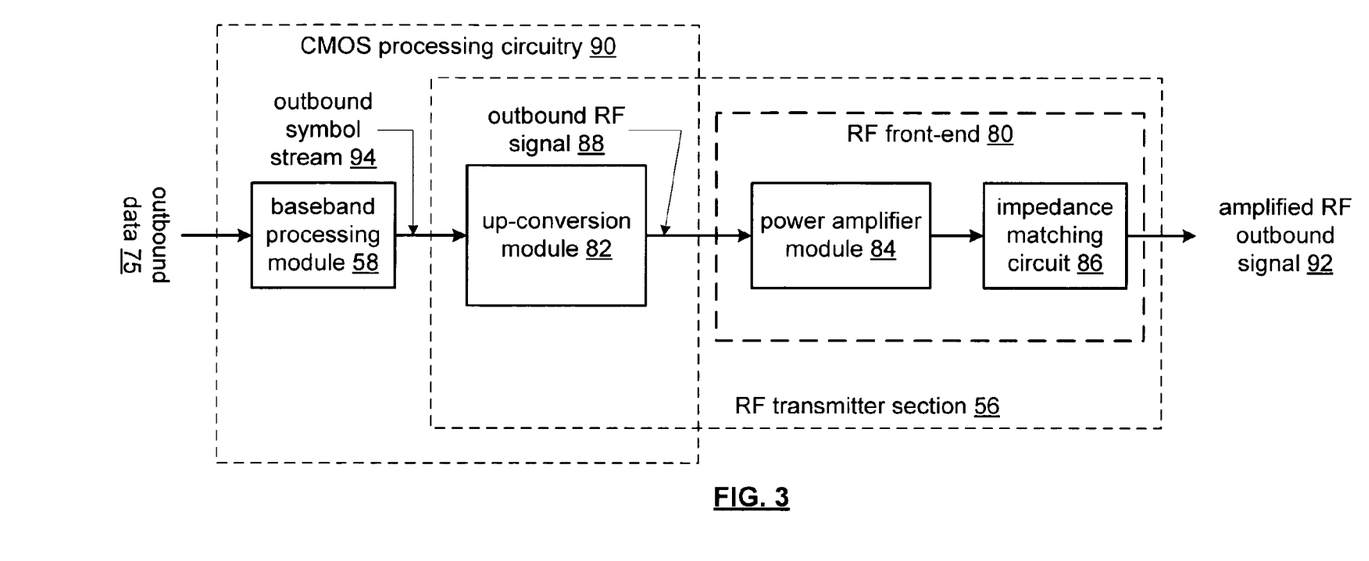
FIG. 3 is a schematic block diagram of an embodiment of a baseband processing module and an RF transmitter section of a wireless communication device in accordance with the present invention.

FIG. 3 is a schematic block diagram of an embodiment of a baseband processing module 58 and an RF transmitter section 56 of a wireless communication device 50. In this embodiment, the RF transmitter section 56 includes an up-conversion module 82 and an RF front end 80. The RF front end 80 includes at least one power amplifier module 84 (which may be bipolar, CMOS, or other IC fabrication technology) and an impedance matching circuit 86. Alternatively, the impedance matching circuit 86 may be included in the antenna interface 60.

Figure 4:
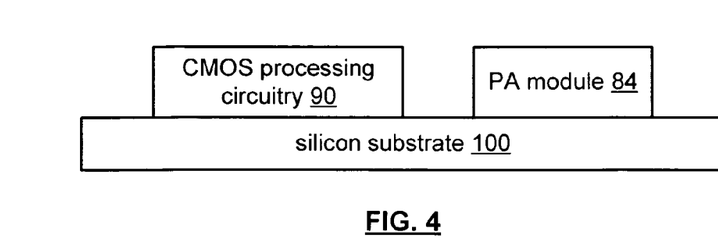
FIG. 4 is a diagram of an embodiment of CMOS processing circuitry and a bipolar power amplifier module in accordance with the present invention.

As shown and with reference to FIG. 4, the baseband processing module 58 and the up-conversion module 82 are implemented as CMOS processing circuitry 90, which is on a silicon substrate 100. In this embodiment, at least a portion of the power amplifier module 84 is implemented using a silicon germanium IC fabrication process and is on the same silicon substrate 100 as the CMOS processing circuitry 90. In an embodiment, the impedance matching circuit 86 may be implemented using a CMOS IC fabrication process and be included on the same silicon substrate 100. In another embodiment, the impedance matching circuit 86 is off-chip. In yet another embodiment, at least a portion of the impedance matching circuit 86 is implementing using the silicon germanium IC fabrication process and is on the same silicon substrate 100. Note that by using such an integration of power amplifiers and CMOS circuitry, CMOS (digital or analog) circuitry can be used to measure and/or improve the performance of PA.

Returning to the discussion of FIG. 3, the baseband processing module 58 converts the outbound data 75 (e.g., a voice signal, data, a text file, an audio file, a video file, an image file, and/or a combination thereof) into an outbound symbol stream, or streams, 94 in accordance with a wireless communication protocol (e.g., IEEE 802.11a, b, g, n, etc., Bluetooth, ZigBee, GSM, CDMA, WCDMA, EDGE, GPRS, HSDPA, HSUPA, etc.). Note that the baseband processing module 58 generates multiple outbound symbol streams from the outbound data when it is functioning in accordance with IEEE 802.11n, when it is performing baseband beamforming, and/or another type of multiple output communication protocol.

The outbound symbol stream, or streams, 94 may be converted to an analog signal and filtered by an analog filter module to produce an analog representation of the outbound symbol stream, or streams, 94. The up conversion module 82 is coupled to convert the analog representation of the outbound symbol stream, or streams, 94 into an outbound RF signal, or signals, 88 based on the transmit local oscillation. In an embodiment, the up conversion module 82 may include one or more pair of mixers and a combining circuit and may further adjust its gain, its load, its frequency response, etc. in accordance with an up conversion control signal.

Figure 6:
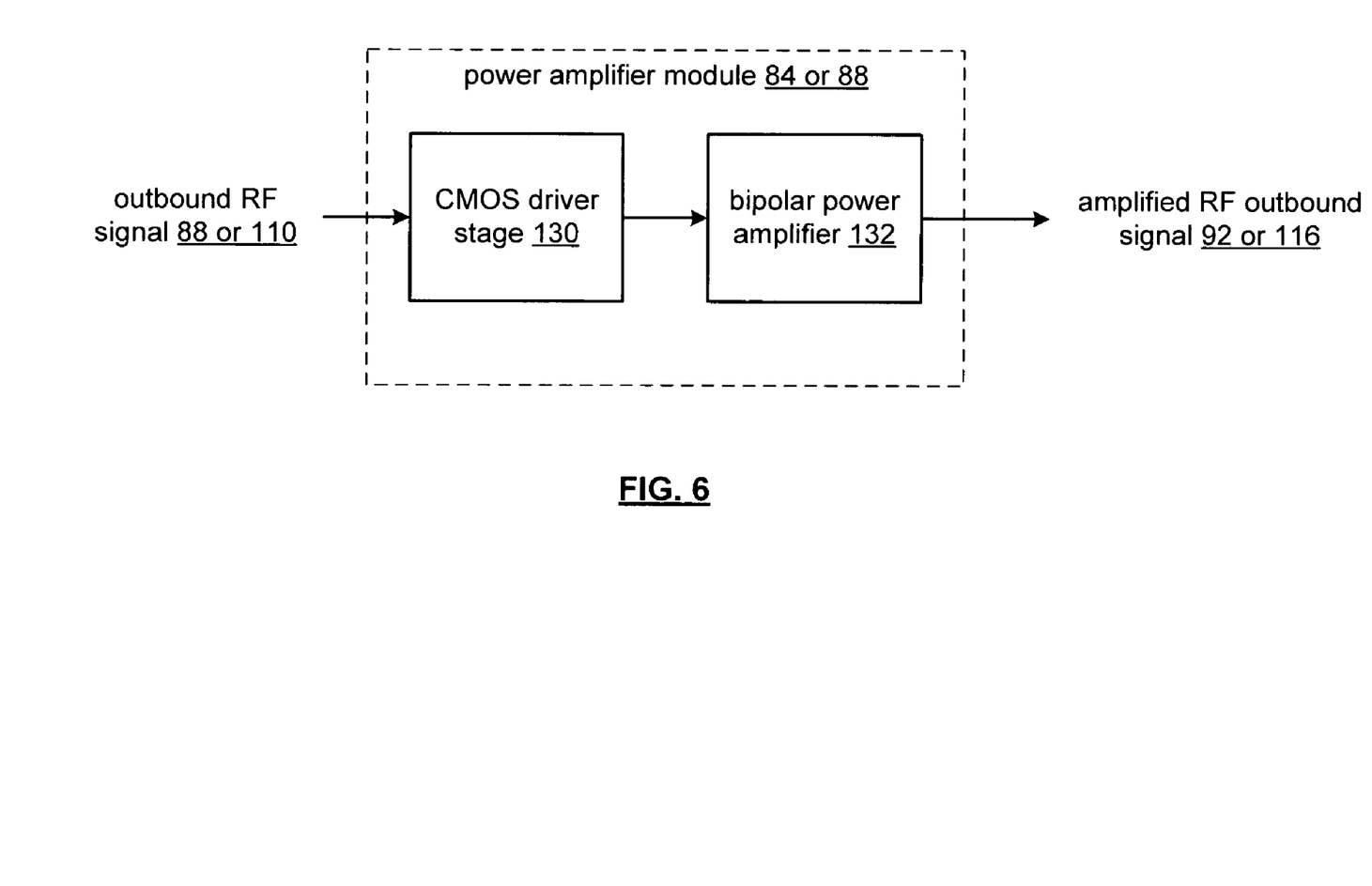
FIG. 6 is a schematic block diagram of an embodiment of a power amplifier module in accordance with the present invention.

The power amplifier module 84, an embodiment of which will be described in greater detail with reference to FIG. 6, is coupled to amplify the outbound RF signal, or signals, 88 to produce an amplified outbound RF signal, or signals, 92. The impedance matching circuit 86, which may include a transformer balun, at least one impedance matching component, and/or a transmission line, provides the amplified outbound RF signal, or signals, 92 to the antenna system.

Figure 5:
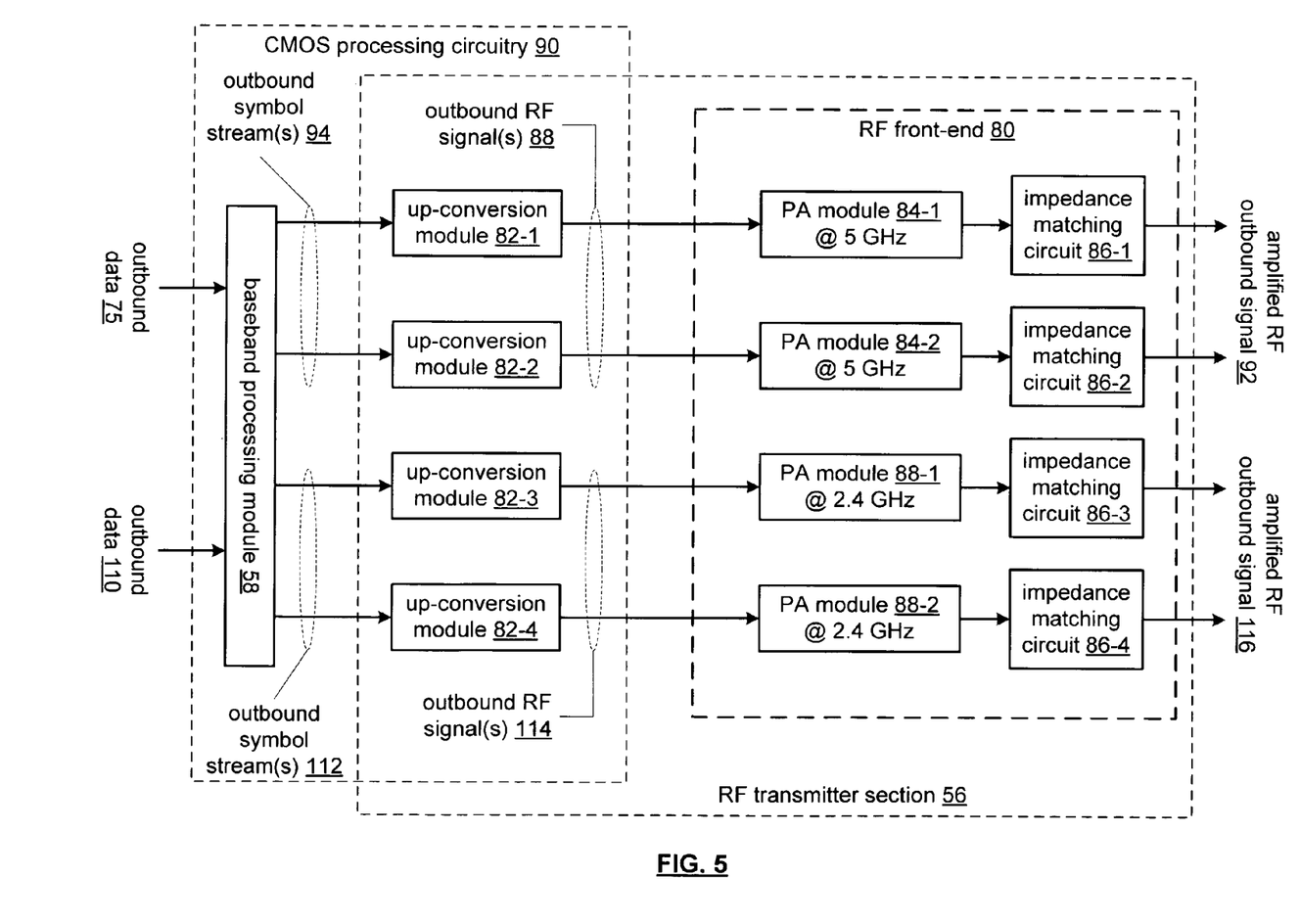
FIG. 5 is a schematic block diagram of another embodiment of a baseband processing module and an RF transmitter section of a wireless communication device in accordance with the present invention.

FIG. 5 is a schematic block diagram of another embodiment of a baseband processing module 58 and an RF transmitter section 56 of a wireless communication device 50. In this embodiment, the RF transmitter section 56 includes a plurality of up-conversion modules 82-1, 82-2, 82-3, and/or 82-4 and the RF front-end 80. The RF front-end includes a plurality of power amplifier (PA) modules 84-1, 84-2, 88-1 operable in different GHz frequency bands, and/or 88-2, and a plurality of impedance matching circuits 86-1, 86-2, 86-3, and/or 86-4.

In an embodiment, the baseband processing module converts the outbound data 75 into two outbound symbol streams 94. Up-conversion modules 82-1 and 82-2 convert the respective outbound symbol streams 94 into outbound RF signals 88, which have a carrier frequency in the 5 GHz frequency band (e.g., 4.90 to 5.85 GHz). The PA modules 84-1 and 84-2, which operate in the 5 GHz frequency band, amplify the outbound RF signals 88 to produce amplified outbound RF signals 92. The impedance matching circuits 86-1 and 86-2 provide the amplified outbound RF signals 92 to the antenna system. In this embodiment, the outbound RF signals 88 may be at least part of a multiple input multiple output (MIMO) communication, a diversity communication, a beamforming communication, or a polarization communication.

In another embodiment, the baseband processing module 58 converts the outbound data 75 into an outbound symbol stream 94 in accordance with a first wireless communication protocol and converts outbound data 110 into an outbound symbol stream 112 in accordance with a second wireless communication protocol. In this instance, the baseband processing module 58 is preparing the outbound data 75 and 110 as at least part of a multiple mode communication.

Up-conversion module 82-1 converts the outbound symbol stream 94 into an outbound RF signal 88, which has a carrier frequency in the 5 GHz frequency band (e.g., 4.90 to 5.85 GHz). The PA module 84-1, which operates in the 5 GHz frequency band, amplifies the outbound RF signal 88 to produce an amplified outbound RF signal 92. The impedance matching circuit 86-1 provides the amplified outbound RF signal 92 to the antenna system.

Up-conversion module 82-3 converts the outbound symbol stream 112 into an outbound RF signal 114, which has a carrier frequency in the 2.4 GHz frequency band (e.g., 1.8 to 2.5 GHz). The PA module 88-1, which operates in the 2.4 GHz frequency band, amplifies the outbound RF signal 114 to produce an amplified outbound RF signal 116. The impedance matching circuit 86-3 provides the amplified outbound RF signal 116 to the antenna system.

In another embodiment, the baseband processing module 58 converts the outbound data 75 into two outbound symbol streams 94. Up-conversion modules 82-1 and 82-2 convert the respective outbound symbol streams 94 into outbound RF signals 88, which have a carrier frequency in the 5 GHz frequency band (e.g., 4.90 to 5.85 GHz). The PA modules 84-1 and 84-2, which operate in the 5 GHz frequency band, amplify the outbound RF signals 88 to produce amplified outbound RF signals 92. The impedance matching circuits 86-1 and 86-2 provide the amplified outbound RF signals 92 to the antenna system.

In addition, the baseband processing module 58 converts the outbound data 110 into two outbound symbol streams 112. Up-conversion modules 82-3 and 82-4 convert the respective outbound symbol streams 112 into outbound RF signals 114, which have a carrier frequency in the 2.4 GHz frequency band (e.g., 1.8 to 2.5 GHz). The PA modules 88-1 and 88-2, which operate in the 2.4 GHz frequency band, amplify the outbound RF signals 114 to produce amplified outbound RF signals 116. The impedance matching circuits 86-3 and 86-3 provide the amplified outbound RF signals 116 to the antenna system. In this embodiment, the outbound RF signals 88 and the outbound RF signals 116 are at least part of a multiple mode MIMO communication, a multiple mode diversity communication, a multiple mode beamforming communication, or a multiple mode polarization communication.

FIG. 6 is a schematic block diagram of an embodiment of a power amplifier module 84 and/or 88. In this embodiment, the power amplifier module 84 and/or 88 includes a CMOS driver stage 130 and a bipolar power amplifier 132. The CMOS driver stage 130 may include one or more CMOS power amplifier drivers coupled in series and/or in parallel to drive the bipolar power amplifier 132.

Figure 7:
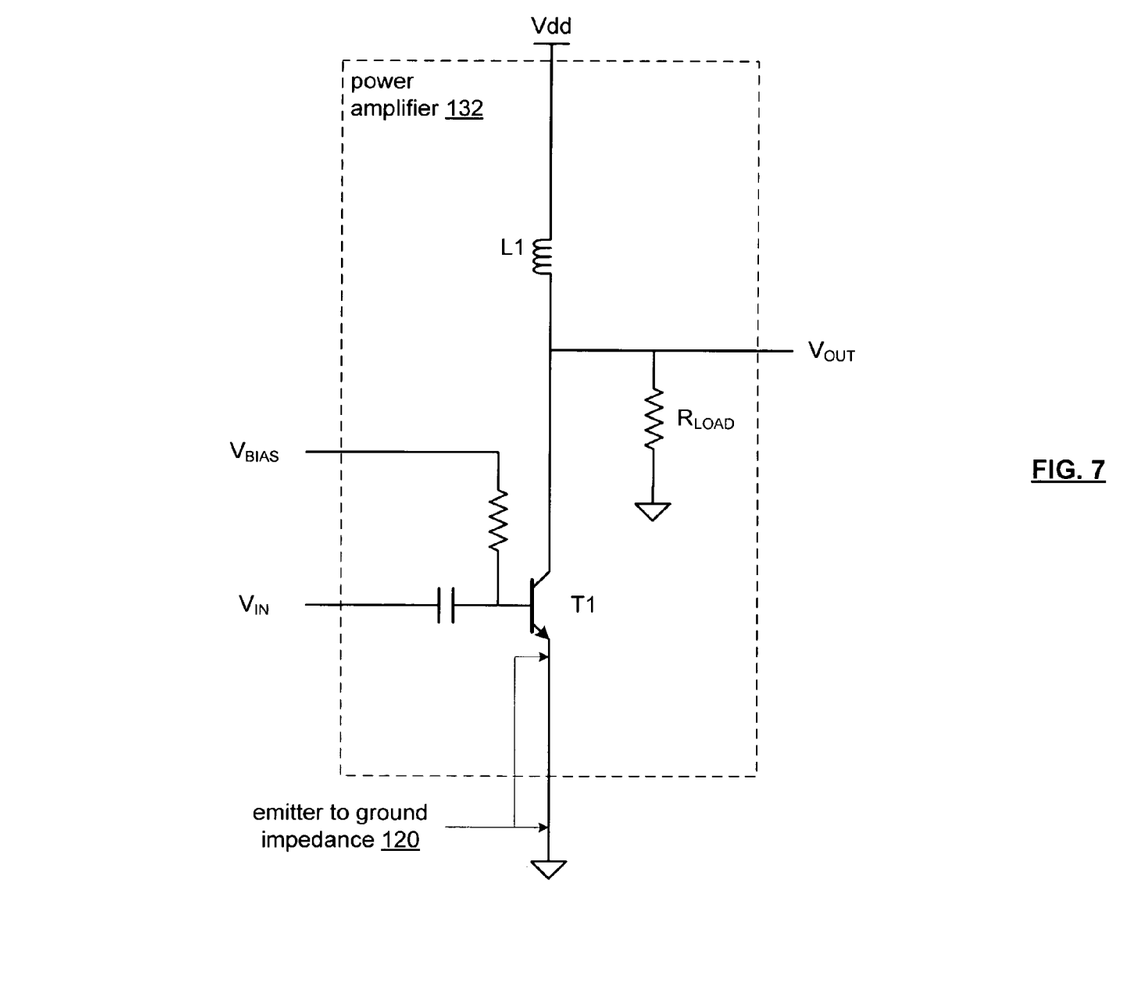
FIG. 7 is a schematic block diagram of an embodiment of a power amplifier in accordance with the present invention.

FIG. 7 is a schematic block diagram of an embodiment of a bipolar power amplifier 132 that includes a bipolar input transistor (T1), an inductive load (L1), and may further include a resistive load $R_{LOAD}$. In this embodiment, the power amplifier 132 has a low emitter to ground impedance 120 (e.g., less than 10 Ohms at 5 GHz) to enable the power amplifier 132 to be implemented on a silicon substrate using a silicon germanium IC fabrication process, while other components of the IC are implemented on the same silicon substrate using a CMOS IC fabrication process.

In one embodiment, the low emitter to ground impedance 120 is achieved by coupling the emitter of the input transistor (T1) to a ground through a wafer via. In another embodiment, the low emitter to ground impedance 120 is achieved by employing a differential architecture for the power amplifier 132 (e.g., further include a mirror image of the single-ended power amplifier circuit), where the emitter of input transistors have a low inductance to a virtual ground (e.g., AC ground). In yet another embodiment, the low emitter to ground impedance 120 is achieved by coupling the emitter of the input transistor (T1) to ground using a plurality of bond wires and by using a thin wafer.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as bipolar transistors, as one of ordinary skill in the art will appreciate, the transistors may be implemented using any type of transistor structure including, but not limited to, Bi-CMOS, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio frequency integrated circuit (RFIC) comprises:
a silicon substrate;
CMOS processing circuitry on the silicon substrate;
a bipolar power amplifier module on the silicon substrate, wherein the bipolar power amplifier module is operable in a 5 GHz frequency band and wherein the bipolar power amplifier module includes a low emitter to ground impedance; and
a second bipolar power amplifier module on the silicon substrate, wherein the second bipolar power amplifier module is operable in a 2.4 GHz frequency band.

2. The RFIC of claim 1 further comprises:
a third bipolar power amplifier module on the silicon substrate, wherein the third bipolar power amplifier module is operable in the 5 GHz frequency band.

3. The RFIC of claim 1, wherein the bipolar power amplifier module comprises:
the low emitter to ground impedance facilitating gain of the bipolar power amplifier module.

4. The RFIC of claim 3, wherein the bipolar power amplifier module comprises:
a wafer via coupling to provide the low emitter to ground impedance.

5. The RFIC of claim 3, wherein the bipolar power amplifier module comprises:
a differential architecture having a low inductance to a virtual ground to provide the low emitter to ground impedance.

6. The RFIC of claim 3, wherein the bipolar power amplifier module comprises:
a thin wafer and multiple bond wires coupling an emitter of the bipolar power amplifier module to a ground to provide the low emitter to ground impedance.

7. The RFIC of claim 1, wherein the bipolar power amplifier module comprises:
a CMOS driver stage; and
a bipolar power amplifier coupled to the CMOS driver stage.

8. A radio frequency integrated circuit (RFIC) comprises:
a silicon substrate;
a CMOS baseband processing module on the silicon substrate, wherein the CMOS baseband processing module is coupled to convert outbound data into an outbound symbol stream;
CMOS transmitter circuitry on the silicon substrate, wherein the CMOS transmitter circuitry is coupled to convert the outbound symbol stream into an outbound RF signal; and
a bipolar power amplifier module on the silicon substrate, wherein the bipolar power amplifier module is operable in a 5 GHz frequency band to amplify the outbound RF signal wherein the bipolar power amplifier module includes a low emitter to ground impedance.

9. The RFIC of claim 8 further comprises:
a second bipolar power amplifier module on the silicon substrate, wherein the second bipolar power amplifier module is operable in the 5 GHz frequency band to amplify a second outbound RF signal, wherein the outbound RF signal and the second outbound RF signal are at least part of a multiple input multiple output (MIMO) communication, a diversity communication, a beamforming communication, or a polarization communication.

10. The RFIC of claim 8 further comprises:
a second bipolar, power amplifier module on the silicon substrate, wherein the second bipolar power amplifier module is operable in a 2.4 GHz frequency band to amplify a second outbound RF signal, wherein the outbound RF signal and the second outbound RF signal are at least part of a multiple mode communication.

11. The RFIC of claim 8 further comprises:
a second bipolar power amplifier module on the silicon substrate, wherein the second bipolar power amplifier module is operable in the 5 GHz frequency band to amplify a second outbound RF signal, wherein the outbound RF signal and the second outbound RF signal are at least part of a multiple input multiple output (MIMO) communication, a diversity communication, a beamforming communication, or a polarization communication;
a third bipolar power amplifier module on the silicon substrate, wherein the third bipolar power amplifier module is operable in a 2.4 GHz frequency band to amplify a third outbound RF signal; and
a fourth bipolar power amplifier module on the silicon substrate, wherein the fourth bipolar power amplifier module is operable in the 2.4 GHz frequency band to amplify a fourth outbound RF signal, wherein the third outbound RF signal and the fourth outbound RF signal are at least part of a second MIMO communication, a second diversity communication, a second beamforming communication, or a second polarization communication.

12. The RFIC of claim 8, wherein the bipolar power amplifier module comprises:
the low emitter to ground impedance facilitating gain of the bipolar power amplifier module.

13. The RFIC of claim 12, wherein the bipolar power amplifier module comprises:
a wafer via coupling to provide the low emitter to ground impedance.

14. The RFIC of claim 12, wherein the bipolar power amplifier module comprises:
a differential architecture having a low inductance to a virtual ground to provide the low emitter to ground impedance.

15. The RFIC of claim 12, wherein the bipolar power amplifier module comprises:
a thin wafer and multiple bond wires coupling an emitter of the bipolar power amplifier module to a ground to provide the low emitter to ground impedance.

16. The RFIC of claim 8, wherein the bipolar power amplifier module comprises:
a CMOS driver stage; and
a bipolar power amplifier coupled to the CMOS driver stage.

17. A radio frequency integrated circuit (RFIC) comprises:
a silicon substrate;
CMOS processing circuitry on the silicon substrate;
a first power amplifier module on the silicon substrate, wherein the first power amplifier module is operable in a first GHz frequency band; and
a second power amplifier module on the silicon substrate, wherein the second power amplifier module is operable in a second GHz frequency band and wherein at least one of the first and second power amplifier modules includes a bipolar power amplifier having a low emitter to ground impedance.

18. The RFIC of claim 17 further comprises:
the first GHz frequency band including a 5 GHz frequency band; and
the second GHz frequency band including a 2.4 GHz frequency band.

19. The RFIC of claim 17, wherein the bipolar power amplifier module comprises at least one of:
a wafer via coupling to provide the low emitter to ground impedance;
a differential architecture having a low inductance to a virtual ground to provide the low emitter to ground impedance; and
a thin wafer and multiple bond wires coupling an emitter of the bipolar power amplifier module to a ground to provide the low emitter to ground impedance.

20. The RFIC of claim 17, wherein the bipolar power amplifier comprises:
a CMOS driver stage; and
a bipolar power amplifier coupled to the CMOS driver stage.

* * * * *